Figure 1:
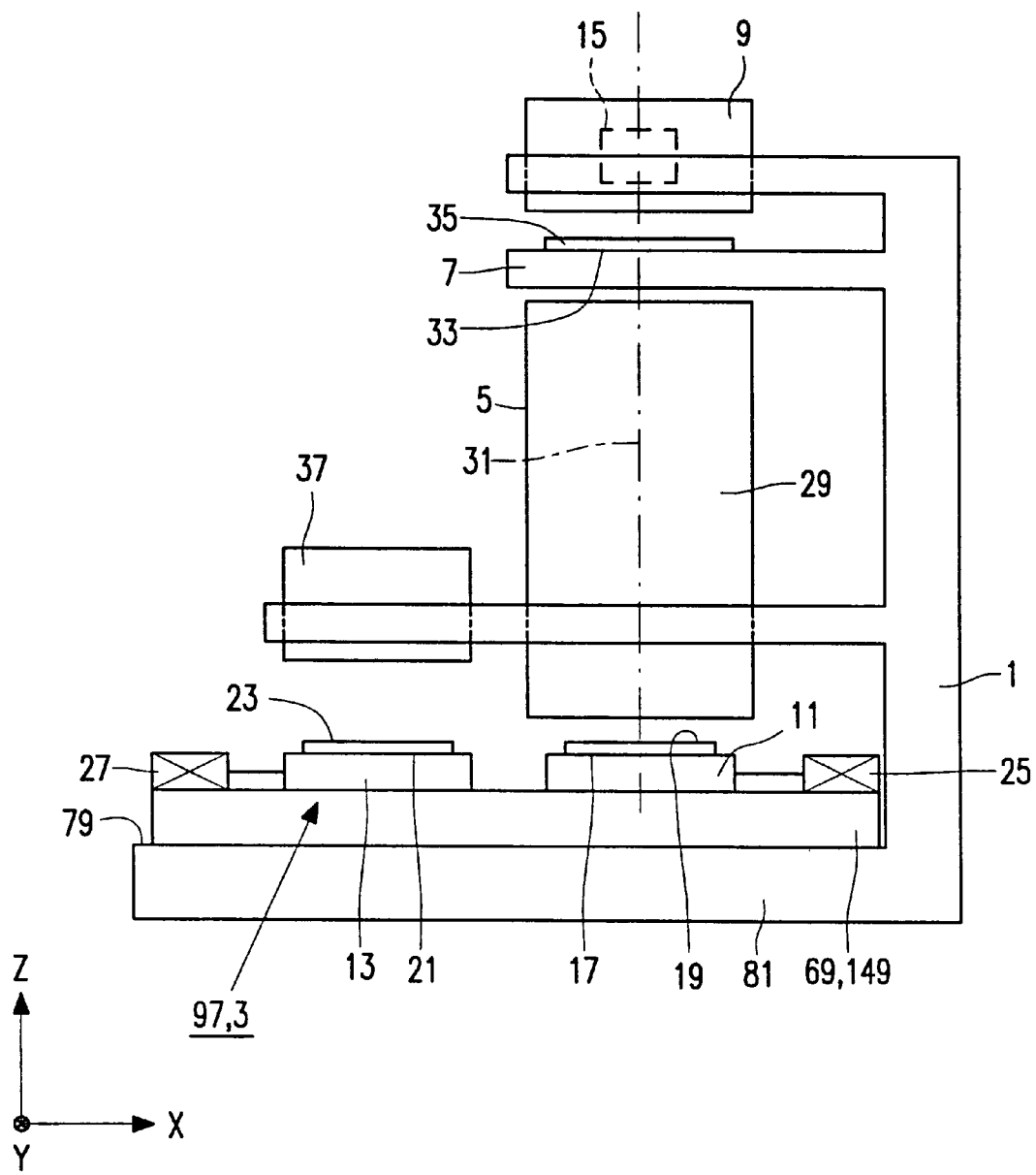

United States Patent [19]
Loopstra et al.

[11] Patent Number: 5,969,441
[45] Date of Patent: *Oct. 19, 1999

[54] TWO-DIMENSIONALLY BALANCED POSITIONING DEVICE WITH TWO OBJECT HOLDERS, AND LITHOGRAPHIC DEVICE PROVIDED WITH SUCH A POSITIONING DEVICE

[75] Inventors: Erik R. Loopstra, Heeze; Gerrit M. Bonnema, Eindhoven; Harmen K. Van Der Schoot, Eindhoven; Gerjan P. Veldhuis, Eindhoven; Paulus M. H. Ter Beek, Veldhoven, all of Netherlands

[73] Assignee: ASM Lithography BV, Veldhoven, Netherlands

[ * ] Notice: This patent issued on a continued prosecution application filed under 37 CFR 1.53(d), and is subject to the twenty year patent term provisions of 35 U.S.C. 154(a)(2).

[21] Appl. No.: 08/948,471

[22] Filed: Oct. 10, 1997

[30] Foreign Application Priority Data

Dec. 24, 1996 [EP] European Pat. Off. .............. 96203709
Mar. 10, 1997 [EP] European Pat. Off. .............. 97200706

[51] Int. Cl.$^6$ .............................. G03F 7/20; H02K 41/00
[52] U.S. Cl. ........................ 310/12; 74/480 R; 248/178.1
[58] Field of Search ........................ 310/12, 51; 318/135; 74/479.01, 480 R; 108/137, 143; 248/178.1

[56] References Cited

U.S. PATENT DOCUMENTS

| | | | |
|---|---|---|---|
| 4,768,064 | 8/1988 | Isohata et al. | 355/53 |
| 5,073,912 | 12/1991 | Kobayashi et al. | 378/34 |
| 5,208,497 | 5/1993 | Ishii et al. | 310/12 |
| 5,763,966 | 6/1988 | Hinds | 310/12 |

FOREIGN PATENT DOCUMENTS

| | | | |
|---|---|---|---|
| 0498496A1 | 8/1992 | European Pat. Off. | G03F 7/20 |
| 0525872A1 | 2/1993 | European Pat. Off. | G03F 7/20 |

*Primary Examiner*—Thomas M. Dougherty
*Assistant Examiner*—Judson H. Jones

*Attorney, Agent, or Firm*—Pillsbury Madison & Sutro, LLP

[57] ABSTRACT

Two-dimensionally balanced positioning device with two object holders, and lithographic device provided with such a positioning device.

A positioning device (3, 97, 179) with a first displacement unit (25, 189) for displacing a first object holder (11, 181) and a second displacement unit (27, 191) for displacing a second object holder (13, 183). The object holders can be displaced by the positioning device alternately from a measuring position into an operational position and can be displaced by the respective displacement units independently of one another in the measuring position and in the operational position.

The displacement units are provided with force actuators which each have a first part (47, 49; 117, 119; 215, 217) which is coupled to the relevant object holder and which is displaceable under the influence of a driving force relative to a second part (59, 61; 133, 135, 137, 139; 219, 221) which is fastened to a balancing unit (69, 149, 205) which is common to the two displacement units. The balancing unit is displaceably guided relative to a base (81, 209), so that reaction forces of the displacement units are converted into displacements of the balancing unit relative to the base, and mechanical vibrations in the balancing unit and the base are prevented. The use of the force actuators prevents the displacements of the balancing unit from disturbing the positions of the object holders relative to the base.

The positioning device is further provided with a control unit (83, 169, 237) by means of which at least the parts (47, 49; 121, 123; 219, 221) directed parallel to an X-direction of the X-actuators (39, 41; 105, 107; 211, 213) coupled to the object holders are held in positions parallel to the X-direction. It is also prevented in this manner that positions of the object holders relative to the base are interfered with by rotations of the balancing unit caused by the reaction forces of the displacement units.

The positioning device can be used in a lithographic device for the displacement of a semiconductor substrate relative to an exposure system of the lithographic device and for the displacement of a mask relative to the exposure system.

14 Claims, 7 Drawing Sheets

TWO-DIMENSIONALLY BALANCED POSITIONING DEVICE WITH TWO OBJECT HOLDERS, AND LITHOGRAPHIC DEVICE PROVIDED WITH SUCH A POSITIONING DEVICE

Two-dimensionally balanced positioning device with two object holders, and lithographic device provided with such a positioning device.

The invention relates to a positioning device provided with a base, a first displacement unit with a first object holder which is displaceable relative to the base parallel to an X-direction and parallel to a Y-direction which is perpendicular to the X-direction, and a second displacement unit with a second object holder which is displaceable relative to the base parallel to the X-direction and parallel to the Y-direction, said first and second object holders being displaceable relative to the base consecutively from a measuring position into an operational position, while the first and the second displacement unit each comprise a first part and a second part which are displaceable relative to one another and which exert a driving force on one another during operation, the first parts of the first and the second displacement unit being coupled to the first object holder and to the second object holder, respectively, seen parallel to the X-direction and parallel to the Y-direction.

The invention also relates to a lithographic device provided with a frame to which a radiation source, a mask holder, a focusing unit, and a positioning device are fastened, said focusing unit having a main axis, while the positioning device comprises a substrate holder which is displaceable relative to the focusing unit parallel to an X-direction which is perpendicular to the main axis and parallel to a Y-direction which is perpendicular to the X-direction and perpendicular to the main axis.

The invention also relates to a lithographic device provided with a frame to which a positioning device, a focusing unit, a further positioning device, and a radiation source are fastened, said focusing unit having a main axis, while the positioning device comprises a substrate holder which is displaceable relative to the focusing unit parallel to an X-direction which is perpendicular to the main axis and parallel to a Y-direction which is perpendicular to the X-direction and to the main axis, and the further positioning device comprises a mask holder which is displaceable relative to the focusing unit parallel to at least the X-direction.

A positioning device of the kind mentioned in the opening paragraph is known from EP-A-0 525 872. The known positioning device is used in an optical lithographic device for the manufacture of integrated semiconductor circuits by means of an optical lithographic process. The lithographic device images sub-patterns of such semiconductor circuits present on a mask on a reduced scale on a semiconductor substrate by means of a light source and a system of lenses. Since such semiconductor circuits have a complicated structure, the semiconductor substrates should be exposed a number of times, each time with a different mask having a different sub-pattern. The masks are consecutively taken from a magazine and placed in an operational position in the lithographic device by means of the known positioning device. During the displacement of a mask from the magazine to the operational position, the mask passes a measuring position where a position is measured occupied by the mask relative to a reference of the lithographic device. A position of the object holder by means of which the mask is displaced is measured relative to said reference during the displacement of the mask from the measuring position into the operational position, so that the mask can be placed in a desired operational position with respect to the reference through a suitable displacement of the object holder. The relevant object holder keeps the mask in the desired operational position during the exposure of the semiconductor substrate. Meanwhile, the other object holder takes a next mask from the magazine and moves it into the measuring position. The use of the two displacement units with the two object holders thus renders it possible to measure the position of a subsequent mask relative to the reference already while a previous mask is in the operational position and the semiconductor substrate is being exposed through this previous mask. The manufacturing output of the lithographic device is considerably increased in this manner.

The use of a positioning device of the kind mentioned in the opening paragraph, furthermore, is generally known in machine tools and machining installations. In this case, a position occupied by a workpiece supported by one of the two object holders relative to this object holder is measured in the measuring position. Then the relevant object holder with the workpiece is moved into the operational position in which the workpiece is to be machined. A position occupied by the relevant object holder relative to a reference of the machine tool is measured in the operational position, with the result that the workpiece can be brought into a desired operational position with respect to the reference. Here, again, the use of the two displacement units with the two object tables considerably increases the manufacturing output of the machine tool or machining installation because a next workpiece is already moved into the measuring position while a former workpiece is being processed.

The first and the second displacement unit of the known positioning device each comprise a first part which is fastened to the relevant object holder and a second part which is fastened to the base, said first part and second part of each displacement unit being displaceable relative to one another while exerting a driving force on one another. A disadvantage of the known positioning device is that the two parts of the displacement units are each fastened to the base, which accordingly forms a common base for the first and the second displacement unit. Reaction forces are exerted on the second parts during the displacement of the object holders, which forces are transmitted into the base. Said reaction forces lead to mechanical vibrations in the base, which in their turn are transmitted to the second parts and to the object holders. If the first object holder is present, for example, in the operational position, mechanical vibrations will arise in the first object holder as a result of the reaction forces exerted on the base by the second displacement unit during the displacement of a next mask from the magazine to the measuring position. Such a mutual interference between the two displacement units leads to positioning inaccuracies of the displacement units, which are usually undesirable. In addition, the mechanical vibrations generated in the base are also transmitted to the other parts of the device in which the known positioning device is used, which is usually also undesirable.

It is an object of the invention to provide a positioning device of the kind mentioned in the opening paragraph whose base is common to the two displacement units, while the undesirable mutual interference of the two displacement units mentioned above is prevented as much as possible.

The invention is for this purpose characterized in that the second parts of the first and the second displacement unit, seen parallel to the X-direction and parallel to the Y-direction, are coupled to a balancing unit which is common to the first and to the second displacement unit and which is displaceably guided relative to the base parallel to the X-direction and parallel to the Y-direction, while the first and the second displacement unit each comprise a force actuator for generating the driving force. It is noted that the term "force actuator" is understood to mean an actuator for generating a driving force with a predetermined value. Besides such force actuators, so-called position actuators are known for generating displacements having a predetermined value. Owing to the use of the balancing unit, reaction forces exerted by the first parts of the displacement units of the positioning device on the second parts are not transmitted into the base but are exerted on the balancing unit, which is displaceable relative to the base, and are converted into displacements of the balancing unit relative to the base. Mechanical vibrations in the base and in the balancing unit are prevented as much as possible thereby, so that also the transmission of such vibrations to the object holders is prevented as much as possible. The positions of the object holders relative to the base are determined by the values of the driving forces of the displacement units of the positioning device, the values of said driving forces being controlled by a control unit. Since the driving forces are generated by means of force actuators, these driving forces are substantially independent of the positions of the first parts of the displacement units relative to the second parts, so that the positions of the object holders relative to the base are substantially independent of the position of the balancing unit relative to the object holders. It is achieved thereby that a displacement of the balancing unit relative to the base parallel to the X-direction or parallel to the Y-direction, caused by a reaction force of one of the two displacement units, has substantially no influence on the position of the object holder of the other displacement unit relative to the base, so that mutual interferences between the positioning accuracies of the two displacement units are prevented as much as possible. A simple construction of the positioning device is in addition achieved in that the balancing unit is a common balancing unit for the two displacement units.

It is noted that a photocopying machine is known from U.S. Pat. No. 5,208,497 with a single displacement unit by means of which an optical unit is displaceable parallel to a single scanning direction. The displacement unit also has a balancing unit which is coupled to the optical unit and which is also displaceable parallel to the scanning direction. U.S. Pat. No. 5,208,497, however, does not show the use of two displacement units each with an object holder which is displaceable parallel to an X-direction and parallel to a Y-direction perpendicular to the X-direction, while the displacement units cooperate with a common balancing unit which is also displaceable parallel to the X-direction and parallel to the Y-direction.

A special embodiment of a positioning device according to the invention is characterized in that the force actuators of the first and the second displacement units generate exclusively Lorentz forces. The use of force actuators which generate exclusively Lorentz forces makes the driving forces of the displacement units substantially independent of the relative positions of the first parts and the second parts of the displacement units, and a particularly practical and simple construction of the force actuators is provided.

A further embodiment of a positioning device according to the invention is characterized in that the balancing unit is displaceably guided by means of a static gas bearing over a guiding surface of the base which extends parallel to the X-direction and parallel to the Y-direction. The use of the static gas bearing provides a substantially frictionless guiding of the balancing unit relative to the base, so that displacements of the balancing unit under the influence of reaction forces of the displacement units are not influenced by frictional forces occurring between the balancing unit and the guiding surface of the base. Such an influence on the displacements of the balancing unit leads to undesirable residual mechanical vibrations in the balancing unit and the base.

A yet further embodiment of a positioning device according to the invention is characterized in that the two displacement units are each provided with an X-actuator and a Y-actuator, said X-actuators being each provided with a first part which, seen parallel to the X-direction and parallel to the Y-direction, is coupled to the object holder of the relevant displacement unit and, seen parallel to the X-direction, is displaceable relative to a second part of the relevant X-actuator, while the Y-actuators are each provided with a first part which is fastened to the second part of the X-actuator of the relevant displacement unit and which, seen parallel to the Y-direction, is displaceable relative to a second part of the relevant Y-actuator which is fastened to the balancing unit. In this further embodiment, the object holders are each displaceable parallel to the X-direction by means of a suitable driving force of the X-actuator of the relevant displacement unit, while the object holders are each displaceable together with the X-actuator of the relevant displacement unit parallel to the Y-direction by means of a suitable driving force of the Y-actuator of the relevant displacement unit. Reaction forces of the X-actuators of the two displacement units are transmitted to the balancing unit through the second parts of the X-actuators and through the Y-actuators, while reaction forces of the Y-actuators of the two displacement units are transmitted directly to the balancing unit through the second parts of the Y-actuators.

A special embodiment of a positioning device according to the invention is characterized in that the positioning device is provided with a control unit for controlling at least one actuator by means of which at least the second parts of the X-actuators of the two displacement units are retainable in a position parallel to the X-direction. As was described above, displacements of the balancing unit relative to the base parallel to the X-direction and displacements of the balancing unit relative to the base parallel to the Y-direction, caused by reaction forces of the two displacement units, have substantially no influence on the values of the driving forces of the two displacement units, so that the positions of the two object holders relative to the base are substantially not interfered with by such displacements of the balancing unit. The same holds for displacements of the balancing unit with components parallel to both the X-direction and the Y-direction. The reaction forces of the displacement units, however, also exert a mechanical torque on the balancing unit about an axis which extends perpendicularly to the X-direction and perpendicularly to the Y-direction. Without further measures, said mechanical torque will cause a rotation of the balancing unit and the displacement units coupled thereto about an axis of rotation directed perpendicularly to the X-direction and perpendicularly to the Y-direction. Without a further adaptation of the driving forces of the displacement units, such a rotation would lead to displacements of the object holders relative to the base parallel to the X-direction and parallel to the Y-direction, so that the positions of the object holders relative to the base would be influenced by said rotation of the balancing unit. The use of said control unit for controlling said actuator achieves that at least the second parts of the X-actuators of the displacement units are retained in a position parallel to the X-direction.

Since the object holders are coupled to the first parts of the X-actuators, seen parallel to the X-direction and parallel to the Y-direction, the use of said control unit prevents rotations of the X-actuators and the object holders coupled thereto about an axis of rotation directed perpendicularly to the X-direction and perpendicularly to the Y-direction, so that displacements of the object holders relative to the base arising from such rotations are prevented. Thus the reaction forces of the displacement units as well as the accompanying reaction torques on the balancing unit have substantially no influence on the positions of the object holders relative to the base.

A further embodiment of a positioning device according to the invention is characterized in that the Y-actuators of the displacement units are provided with a common straight guide along which the first parts of the Y-actuators are displaceably guided, while the positioning device is provided with a rotatable unit having a first part which is fastened to the balancing unit and a second part which is rotatable relative to the first part about an axis of rotation extending perpendicularly to the X-direction and perpendicularly to the Y-direction and which is fastened to the common straight guide. In this embodiment, the first parts of the Y-actuators are displaceable independently of one another along the common straight guide, while the first parts of the X-actuators and the object holders coupled thereto are displaceable independently of one another relative to the second parts of the X-actuators which are fastened to the first parts of the Y-actuators. Reaction forces of the X-actuators are transmitted to the balancing unit through the relevant Y-actuators, the common straight guide, and the rotatable unit, while reaction forces of the Y-actuators are transmitted to the balancing unit through the common straight guide and the rotatable unit. The first object holder in the operational position and the second object holder in the measuring position are thus displaceable relative to the base independently of one another during operation. To move the second object holder from the measuring position into the operational position, the common straight guide is rotated through an angle of 180° about said axis of rotation by means of the rotatable unit, so that the first object holder is moved from the operational position into the measuring position at the same time. The use of the common straight guide and the rotatable unit leads to a simple construction of the positioning device, where the first object holder and the second object holder are displaceable from the measuring position into the operational position and from the operational position into the measuring position by means of a simple rotational movement of the common straight guide.

A yet further embodiment of a positioning device according to the invention is characterized in that the control unit controls the rotatable unit. In this embodiment, the rotatable unit has a dual function, so that a particularly simple and practical construction of the positioning device is provided. The rotatable unit is indeed used both for displacing the object holders from the measuring position into the operational position and from the operational position into the measuring position by means of a rotational movement of the common straight guide, and for keeping the common straight guide in a position parallel to the Y-direction through a suitable control of the rotatable unit by the control unit, so that the second parts of the X-actuators are kept in a position parallel to the X-direction.

A special embodiment of a positioning device according to the invention is characterized in that the balancing unit comprises a support body which is provided with a guiding surface which extends parallel to the X-direction and parallel to the Y-direction, which is common to the two object holders, and along which the two object holders are displaceable parallel to the X-direction and parallel to the Y-direction, said object holders being both provided with a coupling member by means of which the relevant object holder can be coupled in turn to the first part of the X-actuator of the first displacement unit and to the first part of the X-actuator of the second displacement unit. The object holders in this embodiment are displaceably guided over the common guiding surface belonging to the balancing unit, for example by means of static gas bearings. The support body is, for example, a granite slab and has a dual function, i.e. supporting and guiding the two object holders, and forming a balancing unit for the two displacement units. When the first object holder is being moved from the measuring position into the operational position and the second object holder is being moved from the operational position into the measuring position, the object holders must pass one another over the common guiding surface. To achieve this, the first object holder is displaced from the measuring position into a first intermediate position between the measuring position and the operational position by means of the first displacement unit, while the second object holder is displaced from the operational position into a second intermediate position next to the first intermediate position between the measuring position and the operational position by means of the second displacement unit. In said intermediate positions, the first object holder is uncoupled from the first displacement unit and coupled to the second displacement unit, whereas the second object holder is uncoupled from the second displacement unit and coupled to the first displacement unit. Then the first object holder is moved from the first intermediate position into the operational position by the second displacement unit, while the second object holder is moved from the second intermediate position into the measuring position by the first displacement unit. Since the object holders are provided with said coupling members, a distance over which the first parts of the displacement units must be displaceable relative to the relevant cooperating second parts of the displacement units is reduced, so that the required dimensions of the displacement units are reduced. It is in addition prevented that the displaceable parts of the first displacement unit and the displaceable parts of the second displacement unit must be capable of passing one another, which would lead to a comparatively complicated construction of the displacement units.

A further embodiment of a positioning device according to the invention is characterized in that the coupling members of the object holders each comprise an XY Lorentz force actuator which is provided with a first part fastened to the relevant object holder and with a second part fastened to the first part of the X-actuator of the relevant displacement unit, the first parts of the XY Lorentz force actuators each being capable of cooperation with the second parts of the two XY Lorentz force actuators. Said XY Lorentz force actuators each have a dual function, so that a simple and practical construction of the positioning device is provided. The object holders can each be displaced over comparatively small distances and with comparatively high accuracies relative to the first part of the X-actuator of the relevant displacement unit by means of said XY Lorentz force actuators. Since the first part and the second part of such a Lorentz force actuator are coupled to one another exclusively by means of a Lorentz force, said parts can be mutually uncoupled and coupled in a simple manner through deactivation and activation, respectively, of the Lorentz force. A construction of the first parts of the XY Lorentz force actuators such that they can each cooperate with both second parts of the XY Lorentz force actuators has the result that the first part of each of the two XY Lorentz force actuators can be taken over by the second part of the other XY Lorentz force actuator in said intermediate positions of the object holders.

A yet further embodiment of a positioning device according to the invention is characterized in that the two displacement units are each provided with two Y-actuators which are each provided with a second part which extends parallel to the Y-direction, while the second parts of the X-actuators of the two displacement units are each pivotable relative to the two first parts of the relevant Y-actuators about pivot axes extending perpendicularly to the X-direction and perpendicularly to the Y-direction, the control unit controlling the Y-actuators of both displacement units. In this embodiment, rotations of the balancing unit relative to the base occur about an axis of rotation directed perpendicularly to the X-direction and perpendicularly to the Y-direction under the influence of the reaction forces of the displacement units, so that also the second parts of the Y-actuators of the two displacement units fastened to the balancing unit are rotated relative to the base. Since the second parts of the X-actuators are each pivotably coupled to both first parts of the Y-actuators of the relevant displacement unit, the second parts of the X-actuators of both displacement units can each be retained in a position parallel to the X-direction in that the two Y-actuators of the relevant displacement unit are displaced over mutually differing distances relative to the balancing unit. The use of a separate actuator for preventing rotations of the balancing unit and the displacement units is thus avoided, so that a comparatively simple construction of the positioning device is achieved.

A lithographic device with a displaceable substrate holder of the kind mentioned in the opening section is known from EP-A-0 498 496. The known lithographic device is used in the manufacture of integrated semiconductor circuits by means of an optical lithographic process. The radiation source of the known lithographic device is a light source, while the focusing unit is an optical lens system by means of which a sub-pattern of an integrated semiconductor circuit is imaged on a reduced scale on a semiconductor substrate which can be placed on the substrate holder of the positioning device, said sub-pattern being present on a mask which can be placed on the mask holder of the lithographic device. Such a semiconductor substrate comprises a large number of fields on which identical semiconductor circuits are to be provided. The individual fields of the semiconductor substrate are for this purpose consecutively exposed, the semiconductor substrate being in a constant position relative to the mask and the focusing unit during the exposure of an inidividual field, while between two consecutive exposure steps a next field of the semiconductor substrate is brought into position relative to the focusing unit by means of the positioning device. This process is repeated a number of times, with a different mask representing a different sub-pattern each time, so that integrated semiconductor circuits of comparatively complicated structure can be manufactured. The structure of such integrated semiconductor circuits has detail dimensions which lie in the sub-micron range. The sub-patterns present on the consecutive masks should accordingly be imaged on said fields of the semiconductor substrate with a mutual accuracy which lies in the sub-micron range. Therefore, the semiconductor substrate should be positioned relative to the mask and the focusing unit with an accuracy which also lies in the sub-micron range by means of the positioning device. To limit the time required for the manufacture of the semiconductor circuits, moreover, the semiconductor substrate should be displaced at a comparatively high speed between two consecutive exposure steps.

According to the invention, the lithographic device with the displaceable substrate holder is characterized in that the positioning device used therein is a positioning device according to the invention, wherein each of the two object holders of the positioning device is a substrate holder of the lithographic device, and the operational position of the substrate holders is a position in which a substrate placeable on a substrate holder can be irradiated by the radiation source via the focusing unit, while the base of the positioning device is fastened to the frame. The use of the positioning device according to the invention renders it possible to utilize the measuring position of the positioning device during operation, for example, for accurately measuring a position occupied by a first semiconductor substrate present on the first substrate holder relative to the first substrate holder. During this, a second semiconductor substrate present on the second substrate holder may be irradiated. As described above, the position of the first substrate holder relative to the base is substantially not influenced by the reaction forces exerted by the displacement unit of the second substrate holder on the balancing unit of the positioning device during the displacements of the second substrate holder which are necessary during the exposure. The measurements of the position of the first semiconductor substrate relative to the first substrate holder is as a result substantially not affected by said reaction forces. The frame of the lithographic device also remains free from such undesirable vibrations because the displacements of the substrate holders cause substantially no mechanical vibrations in the base of the positioning device. Since said position of the first semiconductor substrate has already been accurately measured before the first semiconductor substrate is moved into the operational position, the first semiconductor substrate need not be aligned relative to the focusing unit in the operational position, but a comparatively simple measurement of the position of the first substrate holder relative to the focusing unit can now suffice in the operational position. The use of the positioning device according to the invention leads to a substantial increase in the manufacturing output of the lithographic device because the alignment of a semiconductor substrate relative to the focusing unit is usually a time-consuming operation.

A special embodiment of a lithographic device with a displaceable substrate holder according to the invention is characterized in that the lithographic device comprises a further positioning device by means of which the mask holder is displaceable relative to the focusing unit parallel to at least the X-direction. In this special embodiment of a lithographic device according to the invention, the semiconductor substrate to be manufactured is not in a constant position relative to the mask and the focusing unit during the exposure of an individual field of the semiconductor substrate, but the semiconductor substrate and the mask are instead synchronously displaced parallel to the X-direction relative to the focusing unit during the exposure by means of the displacement unit of the relevant substrate holder and the further positioning device of the mask holder, respectively. The pattern present on the mask is thus scanned parallel to the X-direction and synchronously imaged on the semiconductor substrate. It is achieved thereby that a maximum surface area of the mask which can be imaged on the semiconductor substrate through the focusing unit is limited to a lesser extent by a size of an image field size of the focusing unit.

A further embodiment of a lithographic device with a displaceable substrate holder according to the invention and a lithographic device with a displaceable substrate holder and a displaceable mask holder of the kind mentioned in the opening section are characterized in that the further positioning device is a positioning device according to the invention, wherein each of the two object holders of the further positioning device is a mask holder of the lithographic device which can be positioned by the further positioning device parallel to the X-direction and parallel to the Y-direction, and wherein the operational position of the mask holders is a position in which a mask placeable on a mask holder can be irradiated by the radiation source, while the base of the further positioning device is fastened to the frame. The use of the positioning device according to the invention renders it possible to utilize the measuring position of the further positioning device during operation, for example, for accurately measuring a position occupied by a first mask present on the first mask holder relative to the first mask holder. A second mask present on the second mask holder may be irradiated at the same time. As was described above, the position of the first mask holder relative to the base is substantially not influenced by the reaction forces exerted by the displacement unit of the second mask holder on the balancing unit of the further positioning device during the displacements of the second mask holder which are necessary during the irradiation. The measurement of the position of the first mask relative to the first mask holder is accordingly substantially not influenced by said reaction forces. The frame of the lithographic device also remains free from undesirable vibrations because the displacements of the mask holders cause substantially no mechanical vibrations in the base of the further positioning device. Since said position of the first mask has already been accurately measured before the first mask is moved into the operational position, the first mask need not be aligned relative to the focusing unit in the operational position, but a comparatively simple measurement of the position of the first mask holder relative to the focusing unit can suffice in the operational position. Since the alignment of a mask relative to the focusing unit is usually time-consuming, the use of the positioning device according to the invention leads to a considerable increase in the manufacturing output of the lithographic device.

Figure 2:
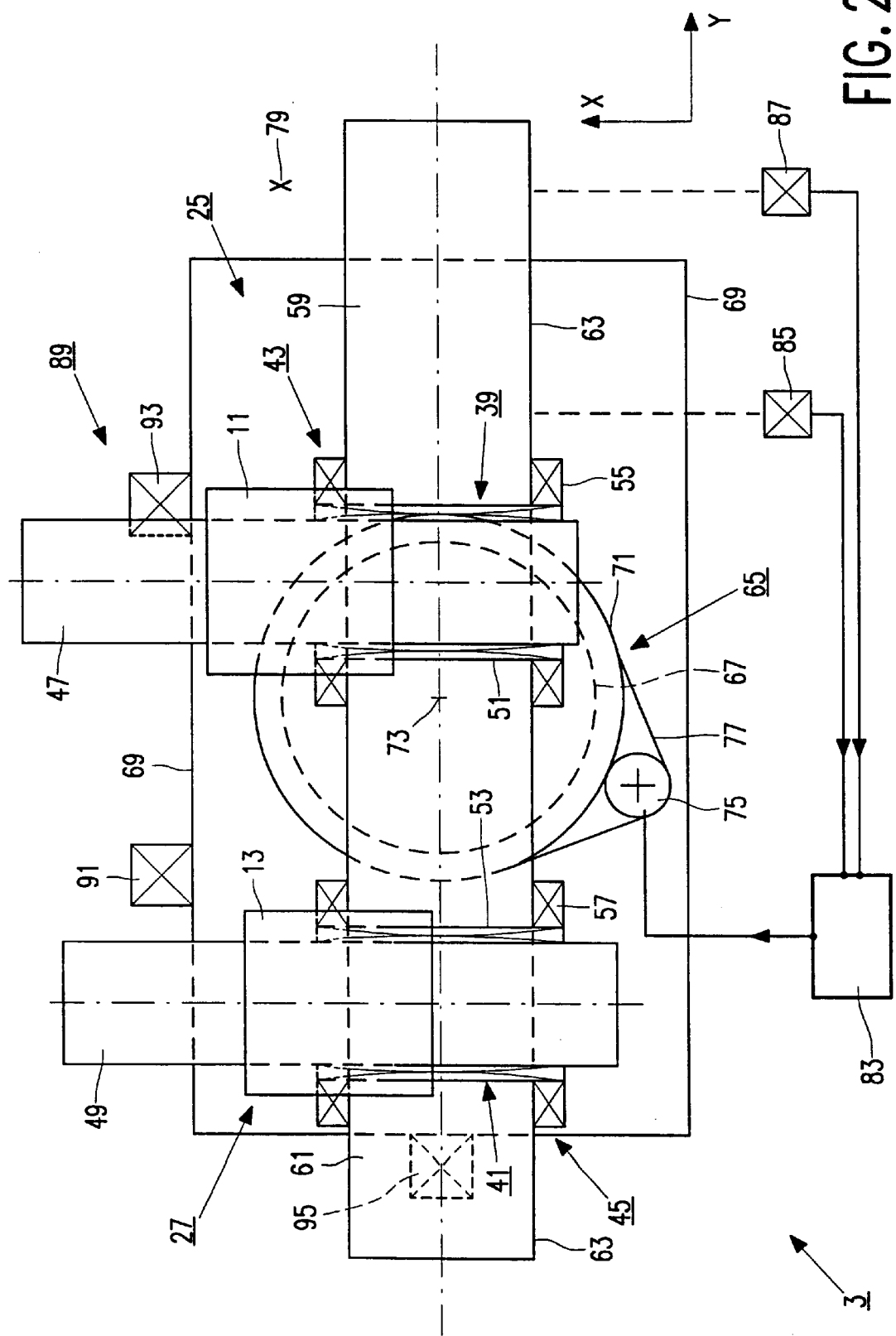
Figure 3:
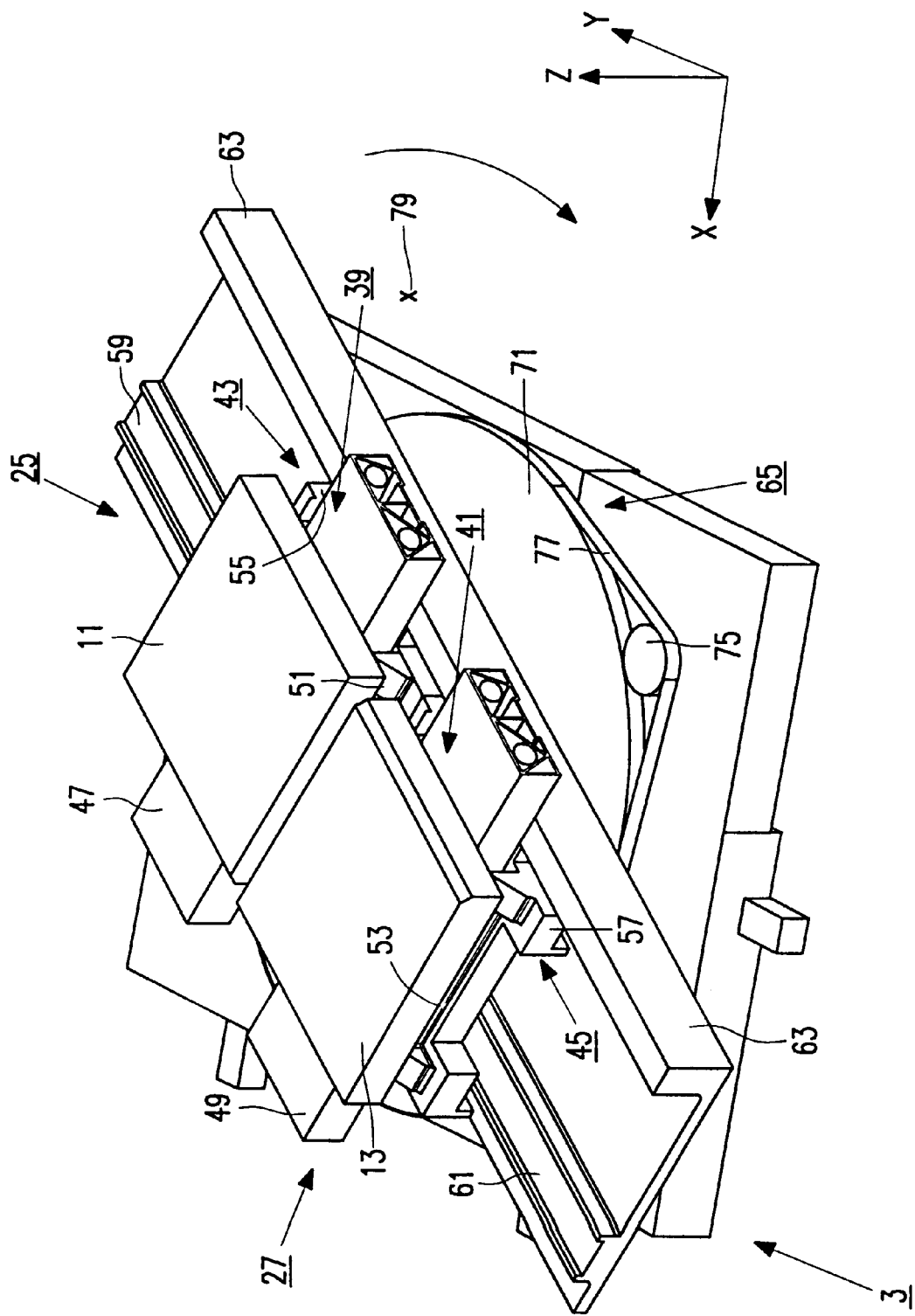
Figure 4:
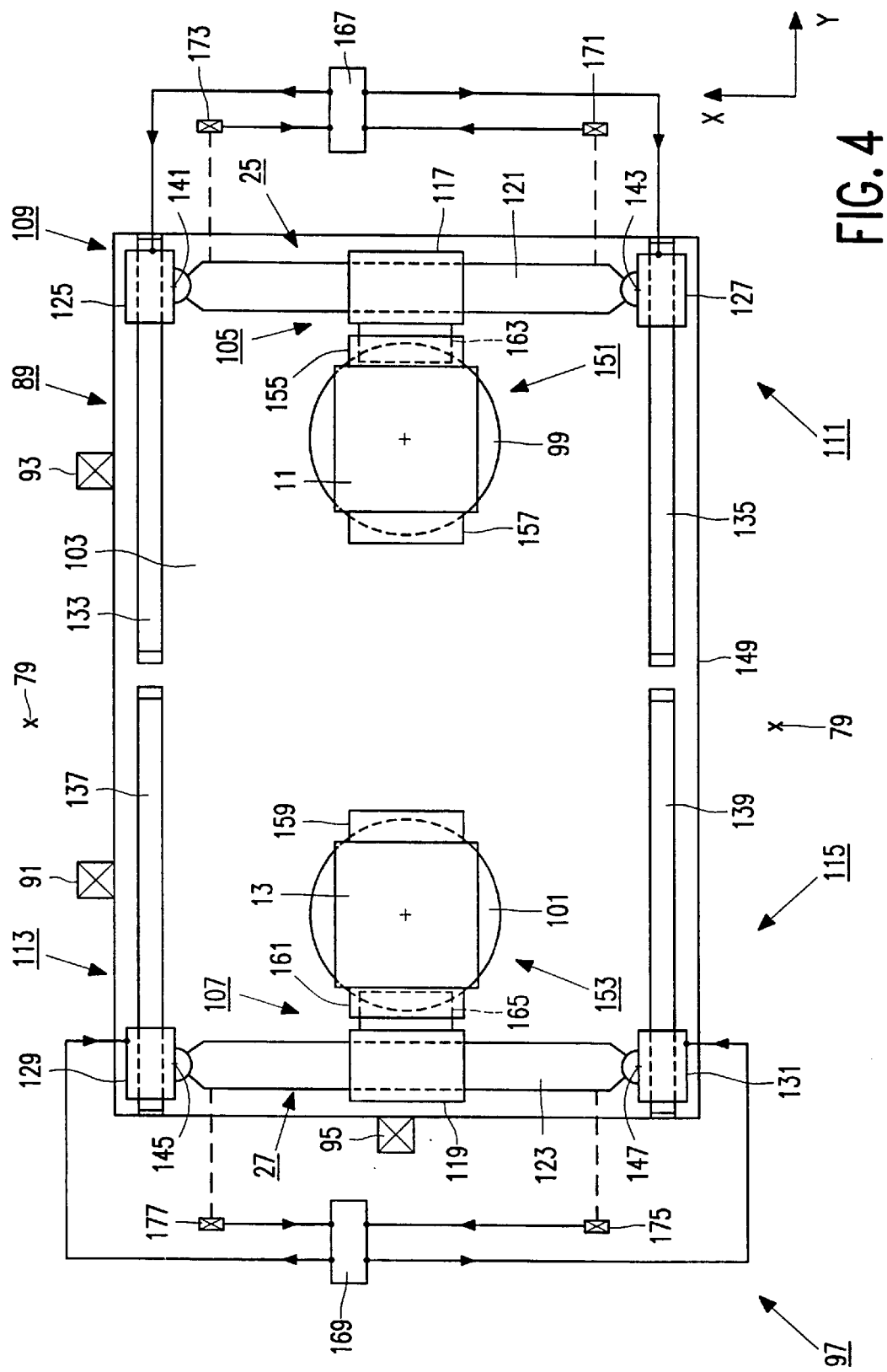
Figure 5:
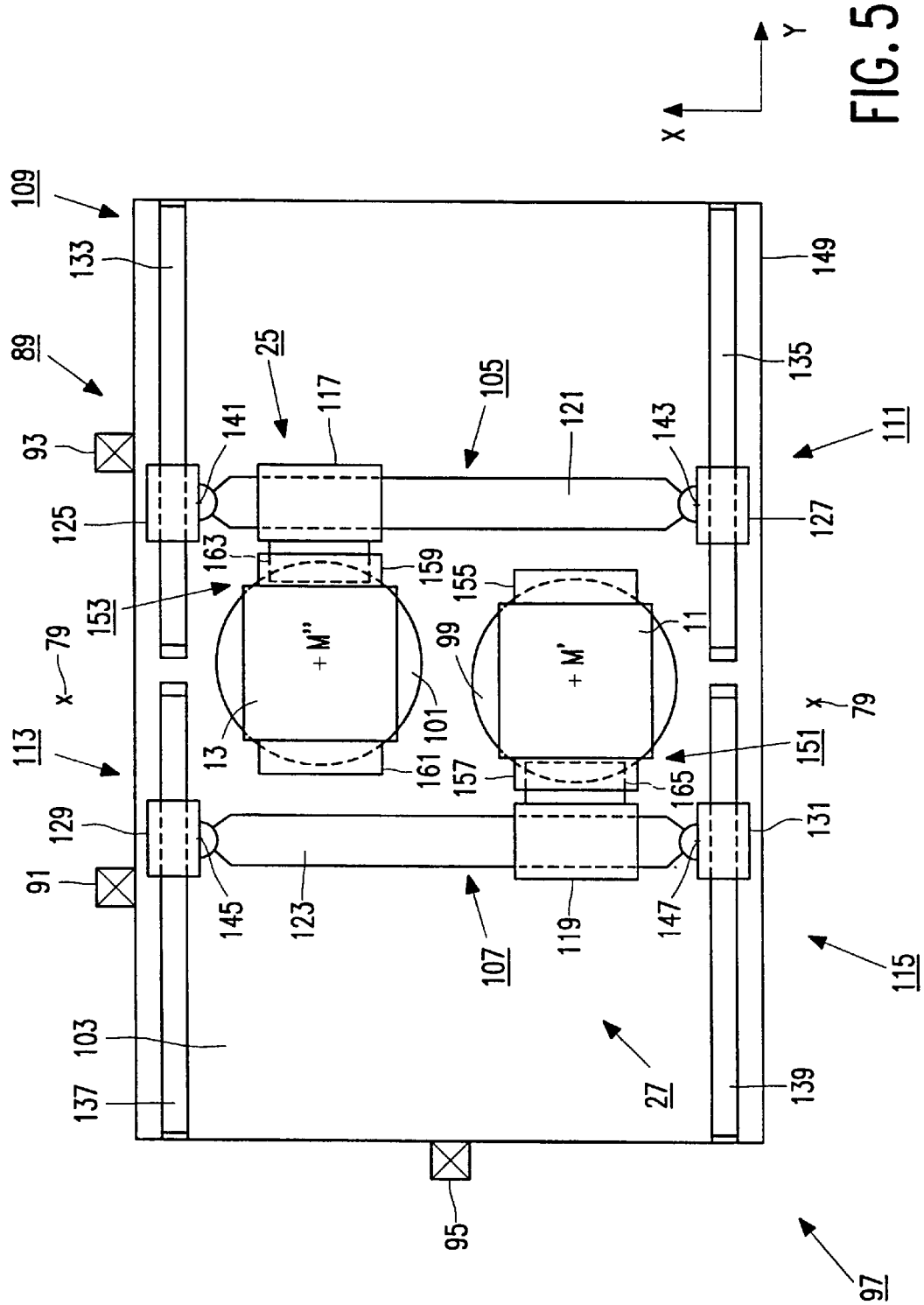
Figure 6:
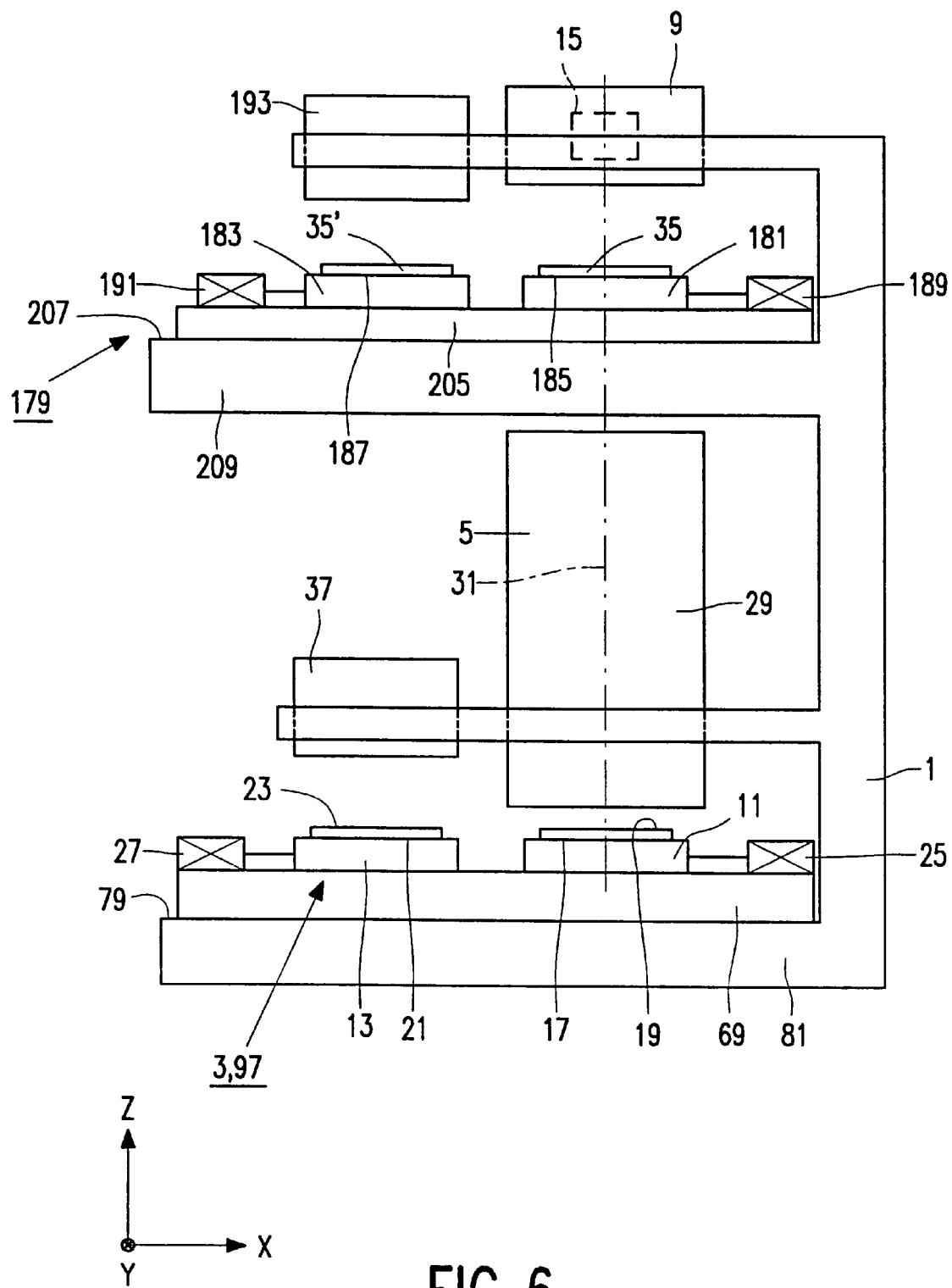
Figure 7:
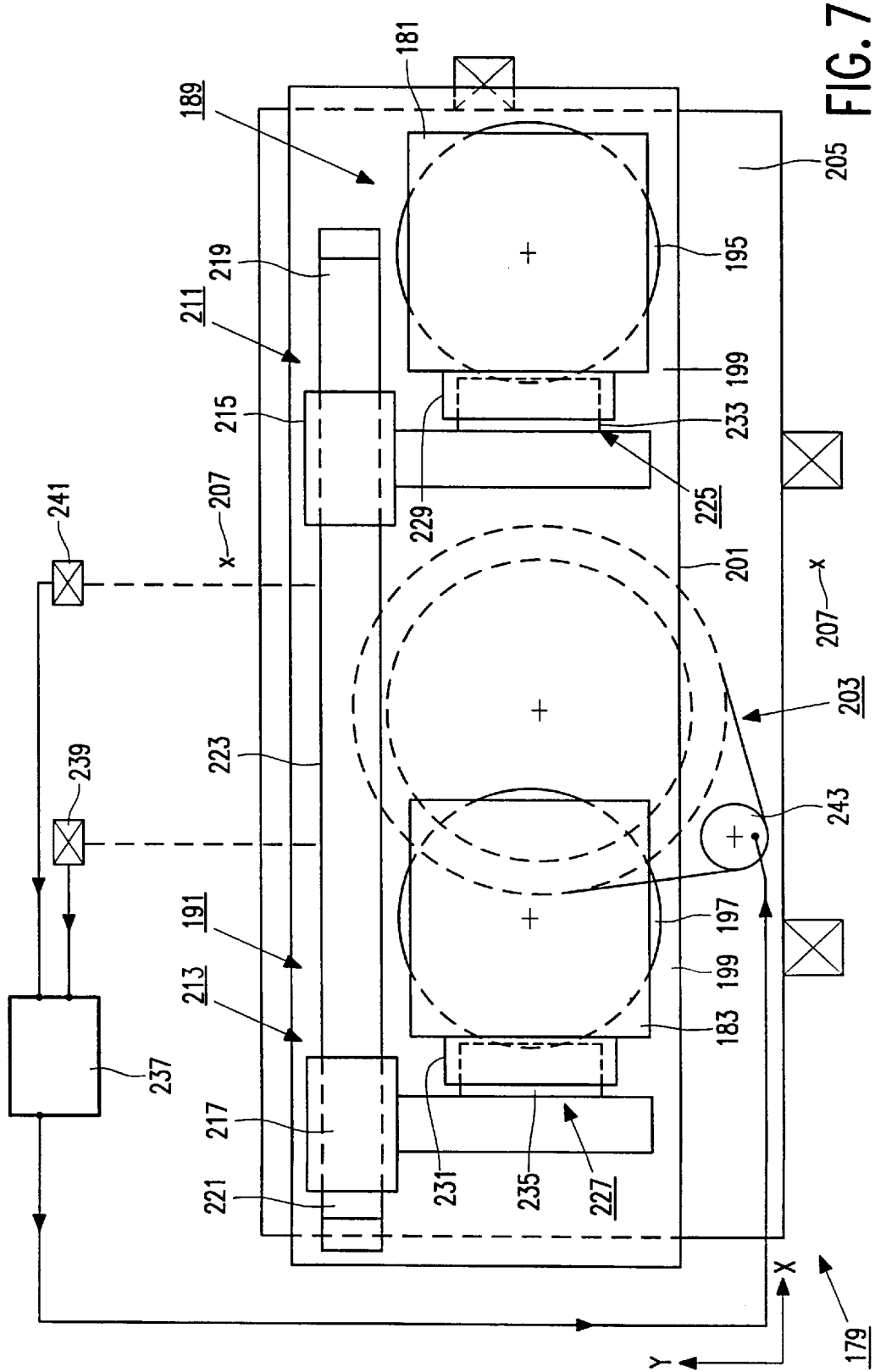

The invention will be explained in more detail below with reference to the drawing, in which FIG. 1 diagrammatically shows a lithographic device with a displaceable substrate holder according to the invention, FIG. 2 is a diagrammatic plan view of a first embodiment of a positioning device according to the invention with which the substrate holder of the lithographic device of FIG. 1 can be displaced, FIG. 3 shows the positioning device of FIG. 2 in a rotated position, FIG. 4 is a diagrammatic plan view of a second embodiment of a positioning device according to the invention with which the substrate holder of the lithographic device of FIG. 1 can be displaced, FIG. 5 shows the positioning device of FIG. 4, two substrate holders of the positioning device being in an intermediate position, FIG. 6 diagrammatically shows a lithographic device with a displaceable substrate holder and a displaceable mask holder according to the invention, and FIG. 7 diagrammatically shows a further positioning device according to the invention which is used for the displacement of the mask holder of the lithographic device of FIG. 6.

The lithographic device according to the invention shown diagrammatically in FIG. 1 is used for the manufacture of integrated semiconductor circuits by an optical lithographic process and by means of an imaging method which follows the so-called "step and repeat" principle. As FIG. 1 diagrammatically shows, the lithographic device is provided with a frame 1 which supports in that order, as seen parallel to a vertical Z-direction, a positioning device 3 according to the invention, a focusing unit 5, a mask holder 7, and a radiation source 9. The positioning device 3 comprises a first substrate holder 11 and an identical second substrate holder 13. The lithographic device shown in FIG. 1 is an optical lithographic device whose radiation source 9 comprises a light source 15. The substrate holders 11 and 13 comprise a support surface 17 which extends perpendicularly to the Z-direction and on which a first semiconductor substrate 19 can be placed and a support surface 21 which extends perpendicularly to the Z-direction and on which a second semiconductor substrate 23 can be placed, respectively. The first substrate holder 11 is displaceable relative to the frame 1 parallel to an X-direction perpendicular to the Z-direction and parallel to a Y-direction perpendicular to the X-direction and perpendicular to the Z-direction by means of a first displacement unit 25 of the positioning device 3, while the second substrate holder 13 is displaceable relative to the frame 1 parallel to the X-direction and parallel to the Y-direction by means of a second displacement unit 27 of the positioning device 3. The focusing unit 5 is an imaging or projection system and comprises an optical lens system 29 with an optical main axis 31 directed parallel to the Z-direction and an optical reduction factor which is, for example, 4 or 5. The mask holder 7 comprises a support surface 33 which extends perpendicularly to the Z-direction and on which a mask 35 can be placed. The mask 35 comprises a pattern or a sub-pattern of an integrated semiconductor circuit. During operation, a light beam originating from the light source 15 is guided through the mask 35 and focused on the first semiconductor substrate 19 by means of the lens system 29, so that the pattern present on the mask 35 is imaged on a reduced scale on the first semiconductor substrate 19. The first semiconductor substrate 19 comprises a large number of individual fields on which identical semiconductor circuits are provided. The fields of the first semiconductor substrate 19 are consecutively exposed through the mask 35 for this purpose. During the exposure of an individual field of the first semiconductor substrate 19, the first semiconductor substrate 19 and the mask 35 are in fixed positions relative to the focusing unit 5, whereas after the exposure of an individual field a next field is brought into position relative to the focusing unit 5 each time in that the first substrate holder 11 is displaced parallel to the X-direction and/or parallel to the Y-direction by the first displacement unit 25. This process is repeated a number of times, with a different mask each time, so that complicated integrated semiconductor circuits with a layered structure are manufactured. The integrated semiconductor circuits to be manufactured by means of the lithographic device have a structure with detail dimensions which lie in the sub-micron range. Since the first semiconductor substrate 19 is exposed consecutively through a number of different masks, the pattern present on these masks should be imaged on the semiconductor substrate 19 with an accuracy which also lies in the sub-micron range, or even in the nanometer range. Therefore, the semiconductor substrate 19 must be positioned relative to the focusing unit 5 with a comparable accuracy between two consecutive exposure steps, so that very high requirements are imposed on the positioning accuracy of the positioning device 3.

A batch of semiconductor substrates under manufacture is consecutively exposed through the mask 35 in the lithographic device shown in FIG. 1, whereupon said batch is consecutively exposed through a next mask. This process is repeated a number of times, each time with another mask. The semiconductor substrates to be exposed are present in a magazine from which the semiconductor substrates are transported consecutively into a measuring position of the positioning device 3 by means of a transport mechanism. Said magazine and said transport mechanism, which are both of a kind usual and known per se, are not shown in FIG. 1 for simplicity's sake. In the state of the lithographic device as shown in FIG. 1, the first substrate holder 11 is in an operational position in which the first semiconductor substrate 19 placed on the first substrate holder 11 can be irradiated by the radiation source 9 through the focusing unit 5. The second substrate holder 13 is in said measuring position of the positioning device 3, in which a position of the second semiconductor substrate 23 placed on the second substrate holder 13 relative to the second substrate holder 13 can be measured in directions parallel to the X-direction and parallel to the Y-direction by means of an optical position measuring unit 37 of the lithographic device, which unit is depicted diagrammatically only in FIG. 1, and in which the second semiconductor substrate 23 is positioned with respect to the second substrate holder 13 with a predetermined accuracy by means of said transport mechanism. As FIG. 1 shows, the optical position measuring unit 37 is also fastened to the frame 1. After the exposure of the first semiconductor substrate 19 has been completed, the first substrate holder 11 is displaced by the positioning device 3 in a manner to be further explained below from the operational position into the measuring position, from whence the first semiconductor substrate 19 is returned to the magazine by said transport mechanism. Simultaneously, the second semiconductor substrate 23 is displaced from the measuring position into the operational position by the positioning device 3 in a manner to be further explained below. Since the position of the second semiconductor substrate 23 relative to the second substrate holder 13 has already been measured in the measuring position and the second semiconductor substrate 23 has already been positioned relative to the second substrate holder 13 with a desired accuracy, a comparatively simple measurement of the position of the second substrate holder 13 relative to the frame 1 and the focusing unit 5 can suffice in the operational position. Measuring and positioning a semiconductor substrate relative to a substrate holder requires comparatively much time, so that the use of the positioning device 3 according to the invention with the two displacement units 25 and 27 achieves a considerable increase in the manufacturing output compared with a lithographic device having only one substrate holder, where the alignment of the semiconductor substrate relative to the substrate holder takes place in the operational position.

FIGS. 2 and 3 show a first embodiment of a positioning device 3 according to the invention which is suitable for use in the lithographic device of FIG. 1. The two displacement units 25 and 27 of the positioning device 3 are each provided with an X-actuator 39, 41 and a Y-actuator 43, 45. The X-actuators 39, 41 are each provided with a first part 47, 49 which extends parallel to the X-direction, which is fastened to the substrate holder 11, 13 of the relevant displacement unit 25, 27, and which is displaceable relative to a second part 51, 53 of the relevant X-actuator 39, 41. The Y-actuators 43, 45 are each provided with a first part 55, 57 which is fastened to the second part 51, 53 of the X-actuator 39, 41 of the relevant displacement unit 25, 27 and which is displaceable relative to a second part 59, 61 of the relevant Y-actuator 43, 45 which extends parallel to the Y-direction. The X-actuators 39, 41 and the Y-actuators 43, 45 are so-called force actuators, wherein the first parts 47, 49 and the cooperating second parts 51, 53 of the X-actuators 39, 41 exert a mutual driving force of a predetermined value parallel to the X-direction during operation, while the first parts 55, 57 and the cooperating second parts 59, 61 of the Y-actuators 43, 45 exert a mutual driving force parallel to the Y-direction during operation which also has a predetermined value. The force actuators are, for example, so-called linear Lorentz force motors which are usual and known per se and which generate exclusively a Lorentz force of a predetermined value during operation. The substrate holders 11, 13 are thus each displaceable parallel to the X-direction independently of one another by means of a suitable driving force of the X-actuator 43, 45 of the relevant displacement unit 25, 27. The substrate holders 11, 13, each together with the X-actuator 43, 45 of the relevant displacement unit 25, 27, are displaceable parallel to the Y-direction independently of one another by means of a suitable driving force of the Y-actuator 43, 45 of the relevant displacement unit 25, 27.

As FIGS. 2 and 3 further show, the Y-actuators 43, 45 of the displacement units 25, 27 are provided with a common straight guide 63 along which the first parts 55 and 57 of the Y-actuators 43 and 45 are displaceably guided, seen parallel to the Y-direction. The positioning device 3 is further provided with a rotatable unit 65 which is shown diagrammatically only in the Figures and which is provided with a first disc-shaped part 67 which is fastened to a balancing unit 69 of the positioning device 3 to be described in more detail below, and a second disc-shaped part 71 which is fastened to the common straight guide 63. The second disc-shaped part 71 is rotatable relative to the first disc-shaped part 67 about an axis of rotation 73 which extends parallel to the Z-direction. For this purpose, the rotatable unit 65 is provided with an electric motor 75 which is depicted diagrammatically only in the Figures and which is fastened to the balancing unit 69 and coupled to the second disc-shaped part 71 by means of a drive belt 77. After the first semiconductor substrate 19 has been exposed in the operational position during operation and the second semiconductor substrate 23 has been aligned relative to the second substrate holder 13 in the measuring position, the second disc-shaped part 71 of the rotatable unit 65 is rotatated about the axis of rotation 73 through an angle of 180° relative to the first disc-shaped part 67, so that the common straight guide 63 together with the first displacement unit 25 and the second displacement unit 27 is rotated about the axis of rotation 73. Said rotation of the common straight guide 63 causes the first displacement unit 25 with the first substrate holder 11 to be displaced in its entirety from the operational position into the measuring position, while the second displacement unit 27 with the second substrate holder 13 is displaced in its entirety from the measuring position into the operational position. FIG. 3 shows the positioning device 3 in a position in which the common straight guide 63 has performed part of the total rotational movement of 180°.

The balancing unit 69 of the positioning device 3 mentioned above comprises a comparatively heavy balancing block made from, for example, granite. The balancing unit 69 is displaceably guided, seen parallel to the X-direction and parallel to the Y-direction, over a guiding surface 79, which extends parallel to the X-direction and parallel to the Y-direction, by means of static gas bearings which are not visible in FIGS. 2 and 3. The guiding surface 79 is provided on a base 81 of the positioning device 3 shown in FIG. 1, which base is fastened to the frame 1 of the lithographic device. The second parts 59 and 61 of the Y-actuators 43 and 45 of the two displacement units 25 and 27 are coupled to the balancing unit 69, seen parallel to the X-direction and parallel to the Y-direction, via the common straight guide 63 and the rotatable unit 65, the balancing unit 69 thus consulting a common balancing unit for the two displacement units 25 and 27 of the positioning device 3. During operation, reaction forces of the Y-actuators 43 and 45 arising from driving forces generated by the Y-actuators 43 and 45 and exerted by the first parts 55 and 57 of the Y-actuators 43 and 45 on the second parts 59 and 61, are transmitted into the balancing unit 69 via the common straight guide 63 and the rotatable unit 65. Reaction forces of the X actuators 39 and 41 arising from driving forces generated by the X-actuators 39 and 41 and exerted by the first parts 47 and 49 of the X-actuators 39 and 41 on the second parts 51 and 53 are transmitted into the balancing unit 69 via the first parts 55 and 57 and the second parts 59 and 61 of the Y-actuators 43 and 45, the common straight guide 63, and the rotatable unit 65. Since the balancing unit 69 is displaceable over the guiding surface 79 parallel to the X-direction and parallel to the Y-direction, the balancing unit 69 is displaced relative to the base 81 parallel to the X-direction and/or parallel to the Y-direction under the influence of said reaction forces transmitted into the balancing unit 69. The balancing unit 69 is comparatively heavy, so the distances over which the balancing unit 69 is displaced relative to the base 81 will be comparatively small. The reaction forces of the two displacement units 25 and 27 are thus converted into displacements of the balancing unit 69 over the guiding surface 79, so that said reaction forces do not cause mechanical vibrations in the balancing unit 69, the base 81 of the positioning device 3, and the frame 1 of the lithographic device. Such mechanical vibrations are undesirable because they lead to undesirable positioning inaccuracies of the two displacement units 25 and 27.

As was described above, the X-actuators 39 and 41 and the Y-actuators 43 and 45 of the displacement units 25 and 27 comprise so-called force actuators for generating a driving force of a predetermined value. The use of such force actuators achieves that the values of the driving forces of the displacement units 25 and 27 are substantially independent of the positions occupied by the first parts 47, 49, 55, 57 of the X-actuators 39, 41 and the Y-actuators 43, 45 relative to the second parts 51, 53, 59, 61. Since the positions of the substrate holders 11 and 13 relative to the base 81 follow from the values of the driving forces of the first displacement unit 25 and the second displacement unit 27, respectively, said positions of the substrate holders 11 and 13 are substantially independent of the relative positions of the first parts 47, 49, 55, 57 and the second parts 51, 53, 59, 61 of the displacement units 25 and 27 owing to the use of the force actuators, and accordingly substantially independent of the position of the balancing unit 69 coupled to the second parts 59 and 61 relative to the substrate holders 11 and 13 coupled to the first parts 47 and 49. It is accordingly clear that displacements of the balancing unit 69 relative to the base 81 directed parallel to the X-direction, displacements of the balancing unit 69 relative to the base 81 directed parallel to the Y-direction, and displacements of the balancing unit 69 relative to the base 81 having both a component parallel to the X-direction and a component parallel to the Y-direction will have substantially no influence on the positions of the substrate holders 11 and 13 relative to the base 81. Such displacements of the balancing unit 69 arise, as described above, as a result of the reaction forces of the displacement units 25 and 27. It is thus achieved that, in the situation shown in FIG. 1, the position of the second substrate holder 13 relative to the position measuring unit 37 and the position of the first substrate holder 11 relative to the focusing unit 5 are not affected by mechanical vibrations or by said displacements of the balancing unit 69, so that mutual interferences between the positioning accuracies of the displacement units 25 and 27 arising from the reaction forces of the displacement units 25 and 27 are prevented.

Since the reaction forces of the displacement units 25 and 27 result in a mechanical torque on the balancing unit 69, the balancing unit 69 is not only displaced parallel to the X-direction and/or parallel to the Y-direction under the influence of the reaction forces but is also rotated about an axis of rotation which is directed parallel to the Z-direction. In contrast to displacements of the balancing unit 69 parallel to the X-direction and/or parallel to the Y-direction, which have substantially no influence on the positions of the substrate holders 11 and 13 relative to the base 81 thanks to the use of the force actuators, such rotations of the balancing unit 69 in general do influence the positions of the substrate holders 11 and 13 relative to the base 81 if no further measures are taken. To prevent such an undesirable influence, the positioning device 3 is provided with a control unit 83 which is diagrammatically shown in FIG. 2 and which cooperates with two optical position sensors 85 and 87 fastened to the base 81 of the positioning device 3. The position sensors 85 and 87 measure a direction of the common straight guide 63 relative to the Y-direction. The electric motor 75 of the rotatable unit 65 is controlled by the control unit 83 such that the common straight guide 63 is retained in a position parallel to the Y-direction during operation, except for those moments when the straight guide 63 is to be rotated through 180°. The first parts 47 and 49 of the X-actuators 39 and 41 are thus kept in a position parallel to the X-direction. Since the common straight guide 63 is retained in a position parallel to the Y-direction by means of the control unit 83, displacements of the balancing unit 69 relative to the base 81 parallel to the X-direction and/or parallel to the Y-direction and also rotations of the balancing unit 69 relative to the base 81 have substantially no influence on the positions of the substrate holders 11 and 13 relative to the base 81, so that also mutual interferences between the positioning accuracies of the displacement units 25 and 27 arising from rotations of the balancing unit 69 caused by the reaction forces are prevented.

The fact that the balancing unit 69 is guided over the guiding surface 79 by means of static gas bearings provides a substantially frictionless guiding of the balancing unit 69 over the guiding surface 79. The displacements of the balancing unit 69 caused by the reaction forces are substantially not interfered with by frictional forces between the balancing unit 69 and the guiding surface 79 as a result, so that the reaction forces are converted substantially completely into displacements of the balancing unit 69 and substantially no residual vibrations are called up in the base 81 and the balancing unit 69.

As FIG. 2 diagrammatically shows, furthermore, the positioning device 3 is also provided with so-called anti-drift means 89. Since the balancing unit 69 is guided over the guiding surface 79 substantially without friction, the balancing unit 69 could drift away over the guiding surface 79 under the influence of external interfering forces, i.e. interfering forces not generated by the positioning device 3, if no further measures are taken. An example of such an interfering force is a component of the force of gravity directed parallel to the guiding surface 79 and acting on the balancing unit 69 and the positioning device 3, which component is present if the guiding surface 79 is not perfectly horizontal. The anti-drift means 89 exert comparatively small anti-drift forces on the balancing unit 69, whereby drifting away of the balancing unit 69 is prevented. The anti-drift means 89 should in addition be so constructed that the displacements of the balancing unit 69 relative to the base 81 caused by the reaction forces of the displacement units 25 and 27 are not disturbed. In the embodiment shown in FIG. 2, the anti-drift means 89 comprise, for example, two mechanical springs 91 and 93 which are fastened to the base 81 and to the balancing unit 69 and which exert a comparatively small spring force on the balancing unit 69 parallel to the X-direction, as well as a mechanical spring 95 which exerts a comparatively small spring force on the balancing unit 69 parallel to the Y-direction.

FIGS. 4 and 5 show a second embodiment of a positioning device 97 according to the invention which is also suitable for use in the lithographic device of FIG. 1. Components of the lithographic device 97 corresponding to components of the lithographic device 3 have been given the same reference numerals in FIGS. 4 and 5. The substrate holders 11 and 13 in the positioning device 97 are each displaceably guided parallel to the X-direction and parallel to the Y-direction over a guiding surface 103, which is common to the two substrate holders 11, 13 and which extends parallel to the X-direction and parallel to the Y-direction, by means of a so-called aerostatically supported foot 99, 101 which is provided with a static gas bearing. The displacement units 25 and 27 of the positioning device 97 are each provided with an X-actuator 105, 107 and with two Y-actuators 109, 111 and 113, 115 which are constructed as force actuators, as in the positioning device 3. The X-actuators 105 and 107 are each provided with a first part 117, 119 which is displaceably guided relative to a second part 121, 123 which extends parallel to the X-direction, while the Y-actuators 109, 111, 113, 115 are each provided with a first part 125, 127, 129, 131 which is displaceably guided relative to a second part 133, 135, 137, 139 which extends parallel to the Y-direction. As FIG. 4 shows, the second parts 121 and 123 of the X-actuators 105 and 107 are each coupled to both first parts 125, 127 and 129, 131 of the two Y-actuators 109, 111 and 113, 115 of the relevant displacement unit 25, 27, said second parts 121 and 123 of the X-actuators 105 and 107 each being pivotable relative to the two first parts 125, 127 and 129, 131 of the relevant Y-actuators 109, 111 and 113, 115 about a pivot axis 141, 143, 145, 147 which is parallel to the Z-direction. The first parts 117 and 119 of the X-actuators can each be coupled to the substrate holder 11, 13 of the relevant displacement unit 25, 27, seen parallel to the X-direction and parallel to the Y-direction, in a manner to be further described below. The second parts 133, 135, 137, 139 of the Y-actuators 109, 111, 113, 115 are each fastened to a balancing unit 149 which is common to the two displacement units 25 and 27, which corresponds to the balancing unit 69 of the positioning device 3, and which is displaceably guided parallel to the X-direction and parallel to the Y-direction by means of static gas bearings not shown in the Figures over a guiding surface 79 which extends parallel to the X-direction and parallel to the Y-direction and which belongs to a base 81 of the positioning device 97 which is fastened to the frame 1. The balancing unit 149 is at the same time a common support body for the two substrate holders 11 and 13, the common guiding surface 103 of the substrate holders 11 and 13 being an upper surface of the balancing unit 149. Like the balancing unit 69 of the positioning device 3, the balancing unit 149 of the positioning device 97 is provided with anti-drift means 89, 91, 93 and 95. The substrate holders 11 and 13 are each displaceable parallel to the X-direction independently of one another by means of respective X-actuators 105 and 107, and are displaceable parallel to the Y-direction independently of one another by means of displacements of equal value of the two Y-actuators 109 and 111 and the two Y-actuators 113 and 115, respectively. During operation, reaction forces of the X-actuators 105 and 107 are transmitted to the balancing unit 149 via the second parts 121 and 123 of the X-actuators 105 and 107, the first parts 125, 127, 129, 131 of the Y-actuators 109, 111, 113, 115, and the second parts 133, 135, 137, 139 of the Y-actuators 109, 111, 113, 115, while reaction forces of the Y-actuators 109, 111, 113, 115 are directly transmitted to the balancing unit 149 via the second parts 133, 135, 137, 139 of the Y-actuators 109, 111, 113, 115.

The substrate holders 11 and 13 are each provided with a coupling member 151, 153 to be described in more detail below, by means of which the substrate holders 11, 13 can be coupled parallel to the X-direction and parallel to the Y-direction alternately to the first part 117 of the X-actuator 105 of the first displacement unit 25 and the first part 119 of the X-actuator 107 of the second displacement unit 27. The coupling member 151 of the first substrate holder 11 is for this purpose provided with a first part 155 by means of which the first substrate holder 11 can be coupled to the first part 117 of the X-actuator 105 of the first displacement unit 25, and with a second part 157 by means of which the first substrate holder 11 can be coupled to the first part 119 of the X-actuator 107 of the second displacement unit 27. Similarly, the coupling member 153 of the second substrate holder 13 is provided with a first part 159 by means of which the second substrate holder 13 can be coupled to the first part 117 of the X-actuator 105 of the first displacement unit 25, and with a second part 161 by means of which the second substrate holder 13 can be coupled to the first part 119 of the X-actuator 107 of the second displacement unit 27. In the situation shown in FIGS. 1 and 4, where the first substrate holder 11 is in the operational position and the second substrate holder 13 in the measuring position, the first substrate holder 11 is coupled to the first part 117 of the X-actuator 105 of the first displacement unit 25 via the first part 155 of the coupling member 151, while the second substrate holder 13 is coupled to the first part 119 of the X-actuator 107 of the second displacement unit 27 via the second part 161 of the coupling member 153. The substrate holders 11 and 13 must pass each other over the common guiding surface 103 upon a displacement of the first substrate holder 11 from the operational position into the measuring position and of the second substrate holder 13 from the measuring position into the operational position. To achieve this, the first substrate holder 11 is displaced by the first displacement unit 25 from the operational position into a first intermediate position M' shown in FIG. 5 between the operational position and the measuring position, while simultaneously the second substrate holder 13 is displaced by means of the second displacement unit 27 from the measuring position into a second intermediate position M" shown in FIG. 5, which lies next to the first intermediate position M' and is also situated between the operational position and the measuring position. The substrate holders 11 and 13 are uncoupled from the first displacement unit 25 and the second displacement unit 27, respectively, in said intermediate positions M' and M". Then the first part 117 of the X-actuator 105 of the first displacement unit 25 is moved from the first intermediate position M' into the second intermediate position M", and coupled in this second intermediate position M" to the first part 159 of the coupling member 153 of the second substrate holder 13. Simultaneously, the first part 119 of the X-actuator 107 of the second displacement unit 27 is moved from the second intermediate position M" into the first intermediate position M', and is coupled in this first intermediate position M' to the second part 157 of the coupling member 151 of the first substrate holder 11. This leads to the situation shown in FIG. 5, where the first substrate holder 11 in the first intermediate position M' is coupled to the first part 119 of the X-actuator 107 of the second displacement unit 27, and where the second substrate holder 13 in the second intermediate position M" is coupled to the first part 117 of the X-actuator 105 of the first displacement unit 25. Finally, the first substrate holder 11 is moved into the measuring position from the first intermediate position M' by the second displacement unit 27, while simultaneously the second substrate holder 13 is moved from the second intermediate position M" into the operational position by the first displacement unit 25. A distance over which the first parts 125, 127, 129, 131 of the Y-actuators 109, 111, 113, 115 are to be displaceable relative to the second parts 133, 135, 137, 139 is reduced by the use of the coupling members 151 and 153, so that the dimensions of the displacement units 25 and 27 are reduced. It is in addition prevented that the second parts 121 and 123 of the X-actuators 105 and 107 should be capable of passing one another, seen parallel to the Y-direction, so that the construction of the displacement units 25 and 27 is kept simple.

The coupling members 151 and 153 of the substrate holders 11 and 13 mentioned above are constructed as so-called XY Lorentz force actuators. The first parts 155 and 159 of the coupling members 151 and 153 for this purpose each comprise a system of permanent magnets which is usual and known per se, while the first part 117 of the X-actuator 105 of the first displacement unit 25 comprises an electric coil system 163 which is usual and known per se and which is designed to cooperate with alternately the first part 155 of the coupling member 151 of the first substrate holder 11 and the first part 159 of the coupling member 153 of the second substrate holder 13. The second parts 157 and 161 of the coupling members 151 and 153 each also comprise a set of permanent magnets which is usual and known per se, while the first part 119 of the X-actuator 107 of the second displacement unit 27 also comprises an electric coil system 165 which is usual and known per se and which is designed to cooperate with alternately the second part 157 of the coupling member 151 of the first substrate holder 11 and the second part 161 of the coupling member 153 of the second substrate holder 13. The XY Lorentz force actuator formed by the coil system 163 and the first part 155 of the coupling member 151 or the first part 159 of the coupling member 153, as applicable, is suitable for generating a Lorentz force parallel to the X-direction, a Lorentz force parallel to the Y-direction, and a moment of Lorentz forces about a moment axis which is directed parallel to the Z-direction, so that the first substrate holder 11 or the second substrate holder 13, as applicable, is displaceable relative to the first part 117 of the X-actuator 105 of the first displacement unit 25 over comparatively small distances parallel to the X-direction and/or parallel to the Y-direction by means of said XY Lorentz force actuator, and is rotatable through comparatively small angles relative to the first part 117 about an axis of rotation which is directed parallel to the Z-direction. Similarly, the XY Lorentz force actuator formed by the coil system 165 and the second part 157 of the coupling member 151 or the second part 161 of the coupling member 153, as applicable, is suitable for generating a Lorentz force parallel to the X-direction, a Lorentz force parallel to the Y-direction, and a moment of Lorentz forces about a moment axis which is directed parallel to the Z-direction, so that the first substrate holder 11 or the second substrate holder 13, as applicable, can be displaced relative to the first part 119 of the X-actuator 107 of the second displacement unit 27 over comparatively small distances parallel to the X-direction and/or parallel to the Y-direction by means of said XY Lorentz force actuator, and is rotatable relative to the first part 119 through comparatively small angles about an axis of rotation which is directed parallel to the Z-direction. The use of the XY Lorentz force actuators described above provides a particularly simple and practical construction of the coupling members 151 and 153, where coupling and uncoupling of the coupling members 151 and 153 is achieved in a simple manner through the activation and deactivation, respectively, of the Lorentz force operating between said magnet systems and coil systems. The XY Lorentz force actuators further act as a second, fine driving stage for the displacement units 25 and 27 by means of which the substrate holders 11 and 13 can be positioned comparatively accurately relative to a first driving stage formed by the X-actuators 105, 107 and the Y-actuators 109, 111, 113, 115.

Like the balancing unit 69 of the positioning device 3, the balancing unit 149 of the positioning device 97 is also rotated about an axis of rotation directed parallel to the Z-direction as a result of the reaction forces of the displacement units 25 and 27 exerted on the balancing unit 149. To prevent such rotations of the balancing unit 149 from leading to undesirable displacements of the substrate holders 11 and 13 relative to the base 81, the positioning device 97 is provided with a first control unit 167 by means of which the second part 121 of the X-actuator 105 of the first displacement unit 25 can be retained in a position parallel to the X-direction, and with a second control unit 169 by means of which the second part 123 of the X-actuator 107 of the second displacement unit 27 can be retained in a position parallel to the X-direction. As FIG. 4 shows, the first control unit 167 cooperates with two optical position sensors 171 and 173 which are fastened to the base 81 and by means of which a direction of the second part 121 of the X-actuator 105 relative to the X-direction is measured. Similarly, the second control unit 169 cooperates with two optical position sensors 175 and 177 which are also fastened to the base 81 and by means of which a direction of the second part 123 of the X-actuator 107 relative to the X-direction is measured. The first control unit 167 controls the two Y-actuators 109 and 111 of the first displacement unit 25 such that the second part 121 of the X-actuator 105 remains in a position parallel to the X-direction in the case of rotations of the balancing unit 149. Similarly, the second control unit 169 controls the two Y-actuators 113 and 115 of the second displacement unit 27 such that the second part 123 of the X-actuator 107 remains in a position parallel to the X-direction in the case of rotations of the balancing unit 149. The fact that the second parts 121 and 123 of the X-actuators 105 and 107 are thus each held in a position parallel to the X-direction prevents rotations of the X-actuators 105, 107 and the substrate holders 11, 13 coupled thereto, which in general would lead to undesirable displacements of the substrate holders 11, 13 relative to the base 81.

An imaging method following the so-called "step and scan" principle is used in the lithographic device according to the invention which is diagrammatically shown in FIG. 6.

Components of the lithographic device shown in FIG. 6 which correspond to components of the lithographic device shown in FIG. 1 have been given the same reference numerals in FIG. 6. In the imaging method by the "step and scan" principle, the first semiconductor substrate 19 is not in a constant position relative to the focusing unit 5 during an exposure, but instead the first semiconductor substrate 19 and the mask 35 are displaced synchronously and parallel to the X-direction relative to the focusing unit 5 during an exposure. The lithographic device of FIG. 6 is for this purpose provided not only with the positioning device 3 for displacing the first semiconductor substrate 19, but also with a further positioning device 179 by means of which the mask 35 is displaceable parallel to the X-direction relative to the focusing unit 5. The further positioning device 179 is again a positioning device according to the invention in the lithographic device of FIG. 6. As FIG. 6 diagrammatically shows, the further positioning device 179 comprises a first mask holder 181 and an identical second mask holder 183. The mask holders 181 and 183 each have a support surface, i.e. a support surface 185 extending perpendicularly to the Z-direction on which a first mask 35 can be placed and a support surface 187 extending perpendicularly to the Z-direction on which a second mask 35' can be placed, respectively. The first mask holder 181 can be positioned relative to the frame 1 parallel to the X-direction and parallel to the Y-direction by means of a first displacement unit 189 of the positioning device 179, while the second mask holder 183 can be positioned relative to the frame 1 parallel to the X-direction and parallel to the Y-direction by means of a second displacement unit 191 of the positioning device 179. In the situation shown in FIG. 6, the first mask holder 181 with the first mask 35 is in an operational position of the further positioning device 179 in which the first semiconductor substrate 19 can be irradiated through the first mask 35, whereas the second mask holder 183 with the second mask 35' is in a measuring position of the further positioning device 179. In this measuring position, a position of the second mask 35' relative to the second mask holder 183 can be measured by means of a further position measuring unit 193 of the lithographic device fastened to the frame 1 of the lithographic device. The second mask 35' can in addition be positioned in the measuring position with a desired accuracy relative to the second mask holder 183 by means of a further transport mechanism which is not shown in FIG. 6 for simplicity's sake and which is used for the transport of masks, which are to be used consecutively, from a mask magazine into the measuring position of the further positioning device 179. After the first mask 35 has been used for irradiating one or several semiconductor substrates, the first mask holder 181 is moved from the operational position into the measuring position by means of the further positioning device 179, the first mask 35 being returned to the mask magazine from the measuring position by said further transport mechanism. Simultaneously, the second mask holder 183 with the second mask 35' is moved from the measuring position into the operational position by the further positioning device 179. The manufacturing output of the lithographic device is thus further increased through the use of the further positioning device 179 according to the invention, because the masks to be used consecutively have already been aligned relative to the relevant mask holders upon reaching the operational position.

The further positioning device 179 is shown diagrammatically in FIG. 7. The mask holders 181 and 183 of the further positioning device 179 are displaceably guided parallel to the X-direction and parallel to the Y-direction over a common guiding surface 199 of a support body 201 extending parallel to the X-direction and parallel to the Y-direction by means of an aerostatically supported foot 195 and an aerostatically supported foot 197, respectively. The support body 201 is fastened via a rotatable unit 203 to a balancing unit 205 which is displaceably guided, seen parallel to the X-direction and parallel to the Y-direction, by means of static gas bearings over a guiding surface 207 which forms part of a base 209 of the further positioning device 179. As FIG. 6 diagrammatically shows, the base 209 of the further positioning device 179 is fastened to the frame 1 of the lithographic device. The rotatable unit 203 and the balancing unit 205 of the further positioning device 179 correspond substantially to the rotatable unit 65 and the balancing unit 69 of the positioning device 3 described earlier.

The first displacement unit 189 and the second displacement unit 191 of the further positioning device 179 each comprise an X-actuator 211 and 213 which is constructed as a force actuator. The X-actuators 211 and 213 each comprise a first part 215 and 217 which is displaceable, seen parallel to the X-direction, relative to a second part 219, 221 of the relevant X-actuator 211, 213 which extends substantially parallel to the X-direction. The second parts 219 and 221 of the X-actuators 211 and 213 are fastened to the support body 201 and comprise a common straight guide 223 which extends substantially parallel to the X-direction. Furthermore, the displacement units 189 and 191 each comprise an XY Lorentz force actuator 225, 227 with a permanent magnet system 229, 231 which is fastened to the mask holder 181, 183 of the relevant displacement unit 189, 191, and an electric coil system 233, 235 which is fastened to the first part 215, 217 of the X-actuator 211, 213 of the relevant displacement unit 189, 191. The mask holders 181 and 183 can be displaced parallel to the X-direction relative to the base 209 over comparatively great distances and with comparatively low accuracies by means of the X-actuators 211 and 213, while the mask holders 181 and 183 can be displaced relative to the first parts 215 and 217 of the X-actuators 211, 213 parallel to the X-direction and the Y-direction over comparatively small distances and with comparatively high accuracies by means of the XY Lorentz force actuators 225 and 227, and are rotatable through limited angles about an axis of rotation directed parallel to the Z-direction relative to said first parts 215 and 217. The use of the XY Lorentz force actuators 225, 227 achieves that the mask holders 181 and 183 can be positioned with comparatively high accuracy parallel to the Y-direction during the exposure of a semiconductor substrate, so that the displacements of the mask holders 181 and 183 directed parallel to the X-direction are to a high degree parallel to the X-direction. Finally, the positioning device 179 has a control unit 237, as does the positioning device 3, by means of which the straight guide 223 is held in a position parallel to the X-direction during operation, except for those moments in which the support body 201 is rotated through 180° relative to the base 209 by means of the rotatable unit 203. As FIG. 7 diagrammatically shows, the control unit 237 cooperates with two optical position sensors 239 and 241, and the control unit 237 controls an electric motor 243 of the rotatable unit 203.

In the lithographic devices shown in FIGS. 1 and 6, a batch of semiconductor substrates under manufacture is irradiated consecutively with a certain mask, whereupon said batch is irradiated consecutively with a next mask. The use of the positioning device 3, 97 according to the invention for the displacement of the semiconductor substrates achieves a considerable increase in the manufacturing output of the lithographic device, which manufacturing output is further increased through the use of the further positioning device 179 according to the invention for the displacement of the masks. It is noted that the invention also applies to lithographic devices in which a semiconductor substrate under manufacture is consecutively irradiated with a series of masks, whereupon a next semiconductor substrate is irradiated with said series of masks. A major increase in the manufacturing output of the lithographic device is achieved already in such a lithographic device if exclusively the positioning device for the displacement of the masks is a positioning device according to the invention, while the positioning device for the displacement of the semiconductor substrates is a conventional positioning device.

The lithographic devices according to the invention described above are used for exposing semiconductor substrates in the manufacture of integrated electronic semiconductor circuits. It is noted that such a lithographic device may also be used in the manufacture of other products provided with structures having detail dimensions in the sub-micron range, where mask patterns are imaged on a substrate by means of the lithographic device. Examples of this are structures of integrated optical systems, or conduction and detection patterns of magnetic domain memories, as well as structures of liquid crystal image display patterns.

It is further noted that a positioning device according to the invention may be used not only in a lithographic device but also in finishing machines, machine tools, and other machines or devices in which an object to be processed is aligned relative to an object holder in a measuring position and is subsequently processed in an operational position.

The displacement units 25 and 27 of the positioning device 3 according to the invention as described above each comprise an X-actuator 39, 41 and a Y-actuator 43, 45. The displacement units 25, 27 of the positioning device 97 according to the invention as described above each comprise an X-actuator 105, 107, two Y-actuators 109, 111 and 113, 115, as well as an XY Lorentz force actuator 151, 153. The displacement units 189, 191 of the positioning device 179 according to the invention as described above each comprise an X-actuator 211, 213 and an XY Lorentz force actuator 225, 227. It is noted that a positioning device according to the invention may also be provided with an alternative type of displacement unit. Thus the linear X-actuators and Y-actuators mentioned above may be replaced by so-called planar electromagnetic motors which are usual and known per se. It is alternatively possible in the positioning device 3 to use, for example, an XYZ Lorentz force actuator between each of the two first parts 47 and 49 of the X-actuators 39 and 41 on the one hand and the corresponding substrate holder 11, 13 on the other hand, whereby the substrate holder 11, 13 is made displaceable relative to the corresponding first part 47, 49 over small distances and with high accuracies parallel to the X-direction, parallel to the Y-direction, and parallel to the Z-direction, and whereby the substrate holder 11, 13 is made rotatable relative to the corresponding first part 47, 49 through limited angles about an axis of rotation parallel to the X-direction, an axis of rotation parallel to the Y-direction, and an axis of rotation parallel to the Z-direction. Such XYZ Lorentz force actuators may also be used, for example, in the positioning devices 97 and 179 for replacing the XY Lorentz force actuators and the aerostatically supported feet used therein.

We claim:

1. A positioning device provided with a base, a first displacement unit with a first object holder which is displaceable relative to the base parallel to an X-direction and parallel to a Y-direction which is perpendicular to the X-direction, and a second displacement unit with a second object holder which is displaceable relative to the base parallel to the X-direction and parallel to the Y-direction, said first and second object holders being displaceable relative to the base consecutively from a measuring position into an operational position, while the first and the second displacement unit each comprise a first part and a second part which are displaceable relative to one another and which exert a driving force on one another during operation, the first parts of the first and the second displacement unit being coupled to the first object holder and to the second object holder, respectively, seen parallel to the X-direction and parallel to the Y-direction, characterized in that the second parts of the first and the second displacement unit, seen parallel to the X-direction and parallel to the Y-direction, are coupled to a balancing unit which is common to the first and the second displacement unit and which is displaceably guided relative to the base parallel to the X-direction and parallel to the Y-direction, while the first and the second displacement unit each comprise a force actuator for generating the driving force.

2. A positioning device as claimed in claim 1, characterized in that the force actuators of the first and the second displacement units generate exclusively Lorentz forces.

3. A positioning device as claimed in claim 1, characterized in that the balancing unit is displaceably guided by means of a static gas bearing over a guiding surface of the base which extends parallel to the X-direction and parallel to the Y-direction.

4. A positioning device as claimed in claim 1, characterized in that the two displacement units are each provided with an X-actuator and a Y-actuator, said X-actuators being each provided with a first part which, seen parallel to the X-direction and parallel to the Y-direction, is coupled to the object holder of the relevant displacement unit and, seen parallel to the X-direction, is displaceable relative to a second part of the relevant X-actuator, while the Y-actuators are each provided with a first part which is fastened to the second part of the X-actuator of the relevant displacement unit and which, seen parallel to the Y-direction, is displaceable relative to a second part of the relevant Y-actuator which is fastened to the balancing unit.

5. A positioning device as claimed in claim 4, characterized in that the positioning device is provided with a control unit for controlling at least one actuator by means of which at least the second parts of the X-actuators of the two displacement units are retainable in a position parallel to the X-direction.

6. A positioning device as claimed in claim 4, characterized in that the Y-actuators of the displacement units are provided with a common straight guide along which the first parts of the Y-actuators are displaceably guided, while the positioning device is provided with a rotatable unit having a first part which is fastened to the balancing unit and a second part which is rotatable relative to the first part about an axis of rotation extending perpendicularly to the X-direction and perpendicularly to the Y-direction and which is fastened to the common straight guide.

7. A positioning device as claimed in claim 5, characterized in that the control unit controls the rotatable unit.

8. A positioning device as claimed in claim 4, characterized in that the balancing unit comprises a support body which is provided with a guiding surface which extends parallel to the X-direction and parallel to the Y-direction, which is common to the two object holders, and along which the two object holders are displaceable parallel to the X-direction and parallel to the Y-direction, said object holders being both provided with a coupling member by means of which the relevant object holder can be coupled in turn to the first part of the X-actuator of the first displacement unit and to the first part of the X-actuator of the second displacement unit.

9. A positioning device as claimed in claim 8, characterized in that the coupling members of the object holders each comprise an XY Lorentz force actuator which is provided with a first part fastened to the relevant object holder and with a second part fastened to the first part of the X-actuator of the relevant displacement unit, the first parts of the XY Lorentz force actuators each being capable of cooperation with the second parts of the two XY Lorentz force actuators.

10. A positioning device as claimed in claim 5, characterized in that the two displacement units are each provided with two Y-actuators which are each provided with a second part which extends parallel to the Y-direction, while the second parts of the X-actuators of the two displacement units are each pivotable relative to the two first parts of the relevant Y-actuators about pivot axes extending perpendicularly to the X-direction and perpendicularly to the Y-direction, the control unit controlling the Y-actuators of both displacement units.

11. A lithographic device provided with a frame to which a radiation source, a mask holder, a focusing unit, and a positioning device are fastened, said focusing unit having a main axis, while the positioning device comprises a substrate holder which is displaceable relative to the focusing unit parallel to an X-direction which is perpendicular to the main axis and parallel to a Y-direction which is perpendicular to the X-direction and perpendicular to the main axis, characterized in that the positioning device used therein is a positioning device as claimed in claim 1, wherein each of the two object holders of the positioning device is a substrate holder of the lithographic device, and the operational position of the substrate holders is a position in which a substrate placeable on a substrate holder can be irradiated by the radiation source via the focusing unit, while the base of the positioning device is fastened to the frame.

12. A lithographic device as claimed in claim 11, characterized in that the lithographic device comprises a further positioning device by means of which the mask holder is displaceable relative to the focusing unit parallel to at least the X-direction.

13. A lithographic device as claimed in claim 12, characterized in that the further position device is a positioning device provided with a base, a first displacement unit with a first object holder which is displaceable relative to the base parallel to an X-direction and parallel to a Y-direction which is perpendicular to the X-direction, and a second displacement unit with a second object holder which is displaceable relative to the base parallel to the X-direction and parallel to the Y-direction, said first and second object holders being displaceable relative to the base consecutively from a measuring position into an operational position, while the first and the second displacement unit each comprise a first part and a second part which are displaceable relative to one another and which exert a driving force on one another during operation, the first parts of the first and the second displacement unit being coupled to the first object holder and to the second object holer, respectively, seen parallel to the X-direction and parallel to the Y-direction, characterized in that the second parts of the first and the second displacement unit, seen parallel to the X-direction and parallel to the Y-direction, are coupled to a balancing unit which is common to the first and the second displacement unit and which is displaceably guided relative to the base parallel to the X-direction and parallel to the Y-direction, while the first and the second displacement unit each comprise a force actuator for generating the driving force, wherein each of the two object holders of the further positioning device is a mask holder of the lithographic device which can be positioned by the further positioning device parallel to the X-direction and parallel to the Y-direction, and wherein the operational position of the mask holders is a position in which a mask placeable on a mask holder can be irradiated by the radiation source, while the base of the further positioning device is fastened to the frame.

14. A lithographic device provided with a frame to which a positioning device, a focusing unit, a further positioning device, and a radiation source are fastened, said focusing unit having a main axis, while the positioning device comprises a substrate holder which is displaceable relative to the focusing unit parallel to an X-direction which is perpendicular to the main axis and parallel to a Y-direction which is perpendicular to the X-direction and to the main axis, and the further positioning device comprises a mask holder which is displaceable relative to the focusing unit parallel to at least the X-direction, characterized in that the further positioning device is a positioning device as claimed in claim 1, wherein each of the two object holders of the further positioning device is a mask holder of the lithographic device which can be positioned by the further positioning device parallel to the X-direction and parallel to the Y-direction, and wherein the operational position of the mask holders is a position in which a mask placeable on a mask holder can be irradiated by the radiation source, while the base of the further positioning device is fastened to the frame.

\* \* \* \* \*